United States Patent [19]
Dahm

[11] Patent Number: 5,870,421
[45] Date of Patent: Feb. 9, 1999

[54] SHORT PULSEWIDTH, HIGH PULSE REPETITION FREQUENCY LASER SYSTEM

[76] Inventor: Jonathan S. Dahm, 1614 Walnut, #3, Boulder, Colo. 80302

[21] Appl. No.: 854,813

[22] Filed: May 12, 1997

[51] Int. Cl.⁶ .............................. H01S 3/091; B23K 26/00
[52] U.S. Cl. .................................. 372/75; 372/21; 372/27; 372/25; 372/69; 372/70; 372/98; 372/106; 219/121.68; 219/121.69; 219/121.6; 219/121.61
[58] Field of Search .................................. 372/10, 11, 12, 372/21, 27, 25, 39, 40, 69, 70, 71, 72, 75, 92, 98, 106, 107; 219/121.6, 121.61, 121.68, 121.69, 121.73, 121.74, 121.75, 121.77, 121.83

[56] References Cited

U.S. PATENT DOCUMENTS

| | | |
|---|---|---|
| 5,001,716 | 3/1991 | Johnson et al. .............................. 372/10 |
| 5,034,951 | 7/1991 | Edelstein et al. .......................... 372/22 |
| 5,123,026 | 6/1992 | Fan et al. .................................... 372/75 |
| 5,291,505 | 3/1994 | Nielsen ...................................... 372/38 |
| 5,400,350 | 3/1995 | Galvanauskas ........................... 372/20 |
| 5,598,425 | 1/1997 | Jain et al. .................................. 372/18 |
| 5,611,946 | 3/1997 | Leong et al. .......................... 219/121.6 |
| 5,648,976 | 7/1997 | Franck et al. .............................. 372/25 |
| 5,742,634 | 4/1998 | Rieger et al. .............................. 372/25 |

Primary Examiner—Brian Healy
Attorney, Agent, or Firm—Wilson Sonsini Goodrich & Rosati

[57] ABSTRACT

A laser system capable of high speed silicon wafer dicing is disclosed. A laser with high average power, high repetition rate, ultra-short pulsewidth, and excellent beam quality is described. This is achieved by the use of high power diodes used to uniformly pump an improved Nd:YAlO₃ crystal, resulting in a beam with excellent quality. In addition, a beta-barium borate (BBO) crystal, used in conjunction with drift step recovery diodes (DSRDs), forms a high speed optical switch which can be used to cavity dump the laser.

66 Claims, 18 Drawing Sheets

SHORT PULSEWIDTH, HIGH PULSE REPETITION FREQUENCY LASER SYSTEM

BACKGROUND OF THE INVENTION

1. Field of the Invention

This invention relates to a laser system capable of high precision cutting, suitable for silicon wafer dicing. The laser system uses a diode pumped laser with a short pulsewidth and high pulse repetition frequency. The laser system is also suitable for other purposes, such as surface processing and milling.

2. Description of Related Art

Dicing is a cutting operation that is used to separate integrated circuits (ICs) from their parent wafers. The dicing of IC patterned silicon wafers currently relies on a technology initially developed in the early 1970's. The dicing step is performed by a two-and-one-half inch diameter diamond-impregnated circular saw blade running at extremely high rpms, lubricated by large amounts of water. Material removal occurs through the creation of micro-cracks at the point of contact between the diamond particles and the substrate. As micro-cracks intersect, debris is generated and cutting takes place.

This method of dicing introduces variables that are disadvantageous to the cutting process. The use of diamond embedded blades requires the use of water for lubrication, cooling, and washing away silicon particles. Water in contact with the processed wafer surface creates substantial contamination problems for the ICs and waste water disposal issues, as well as reduces throughput due to the time necessary to dry the wafers. The problem of blade wear requires frequent dressing and changing of the blades, resulting in down time of equipment, and the increased possibility for reproducibility problems.

Current dicing equipment is restricted to uni-directional cutting because the cutting head must be fixed, with movement provided by the substrate positioning stage. The circular blade also restricts the flexibility of cutting geometry to straight lines and 90 degree corners. In addition, the width of the blade restricts the kerf, or cut width, to approximately 25–37.5 microns. The ability of future dicing blade technology to reduce this kerf, and thus increase IC population per wafer, is limited.

The depth of damage and the size of the kerf depend on many different variables, some relating to the properties of the silicon and others to the capabilities of the circular cutting device. A short list of the variables includes the chemical properties of the silicon, blade parameters such as vibration, relative motion of the blade and workpiece, up or down cutting, and the chemistry and delivery of lubricants. The level of damage to the silicon wafer is characterized by the length and distribution of micro-cracks, and the penetration of dislocations. Most importantly, the length and distribution of micro-cracks can influence the future reliability of the IC.

Currently, dicing saw technology allows for a maximum speed of travel across the silicon wafer of approximately 50–75 mm/s. The processing speed of silicon wafers is of extreme importance because it directly translates to higher throughput of the processed substrate. Unfortunately, cut quality is difficult to maintain at high processing speeds due to increased chipping of the substrate and reproducibility problems relating to increased blade wear. In general, attempts to increase the throughput of the process by increasing the cutting speed have resulted in either inferior cut quality, unacceptable blade wear, or both.

The requirement for high cut quality and speed demands the inclusion of many expensive internal components in the current generation of dicing equipment. A large expense relates to the need for very low vibration of the 60,000 rpm blade. Due to the brittle nature of the silicon substrate, the slightest vibration can induce fractures. To minimize vibrational perturbations, the blades are mounted on ultra-expensive air-bearing spindles. Also, the electric inverter needed to operate a motor at high and precise rpms is expensive.

Since the infancy of dicing technology, various academic and industrial labs have attempted to use laser devices to dice silicon wafers. Unfortunately, the results have been less than favorable. In the 1970's, laser dicing of silicon wafers was tried and repudiated. The primary shortcomings were cut quality (surface smoothness) and re-solidified material on the wafer surface. The primary culprit was the pulsewidth of the irradiated energy: a microsecond was far too long a period to prevent destructive heat dissipation into a significant portion of the area immediately surrounding the cut. The difficulty with these longer pulsewidths (actually 1 nanosecond and longer) is that the pulse interacts with the material for too long a time, and the heat affected zone penetrates deep into the substrate.

Recently, one of the largest U.S. manufacturers of dicing saws analyzed the comparative results of conventional blade dicing and laser dicing. The study found that the depth of damage was greater for the laser diced wafers resulting in a lower fracture strength of the silicon substrate. The report stated that the increased damage created by the laser was a result of thermally induced stresses.

These stresses result from excessive heat deposition into the wafer causing collateral damage to the areas of the wafer proximal to the cut. This collateral damage is characterized by micro-cracking and spatter, both entirely unacceptable attributes. The individual silicon chips, or die, that are produced by the dicing of the wafer cannot have micro-cracks exceeding 1 micron in length. Longer cracks are potential future failure sites, as these cracks might eventually propagate due to thermal cycling or vibrations encountered in the field.

Near infra-red (IR) lasers are used for high speed applications due to their ability to generate greater power than their ultra-violet (UV) counterparts. Unfortunately, near IR wavelengths propagate deep into silicon substrates before being absorbed because silicon is semi-transparent at these wavelengths. This results in excess energy deposition deep into the substrate. UV lasers have been used in the past to alleviate this problem, because silicon is highly absorptive to UV wavelengths. However, UV lasers can not develop sufficient power to process silicon at high speeds.

Recently, researchers have found that the deep absorption depth problem associated with near-IR lasers in silicon can be solved using ultra-short pulse widths. Ultra-short pulse widths produce the formation of a near solid density plasma, which acts as a highly energy absorptive layer. The absorbing properties of the plasma prevent the transmission of excess energy deep into the substrate.

Ultra-short pulses alone will not make a feasible laser silicon dicing system. Pulse repetition frequency (PRF), pulse energy and beam quality are very important parameters. Advantages of high pulse repetition frequency include smoother and higher quality cuts, as well as the linear relationship between PRF and processing speed.

It is highly desirable in the semiconductor manufacturing industry to increase the speed of the wafer dicing process, as this results in a significant cost benefit due to higher throughput. However, it is imperative that the quality of the cuts not be compromised by an increase in speed. The current dicing method has not allowed an increase in cutting speed without an unacceptable loss in cut quality.

There is a need for a laser with high average power, short pulsewidth, and high pulse repetition frequency suitable for silicon wafer dicing. There is a need for a laser suitable for silicon wafer dicing with high cutting speeds.

OBJECTS AND SUMMARY OF THE INVENTION

Accordingly, an object of the invention is to provide a laser system with high average power, excellent beam quality, short pulsewidth, and high pulse repetition frequency.

Another object of the invention is to provide a laser system capable of wafer dicing with both excellent cut quality and high speed.

These and other objects of the invention are achieved in a laser system which uses a diode pumped, repetitive, electro-optically cavity dumped, high beam quality, near-IR laser. This laser system is comprised of a resonator cavity of sufficient length to produce the desired pulsewidth, a high speed electro-optic switching device coupled to a high voltage pulser, an intra-cavity aberration corrector, a robust birefringent gain medium, and a high performance pump source.

DETAILED DESCRIPTION

Figure 1:
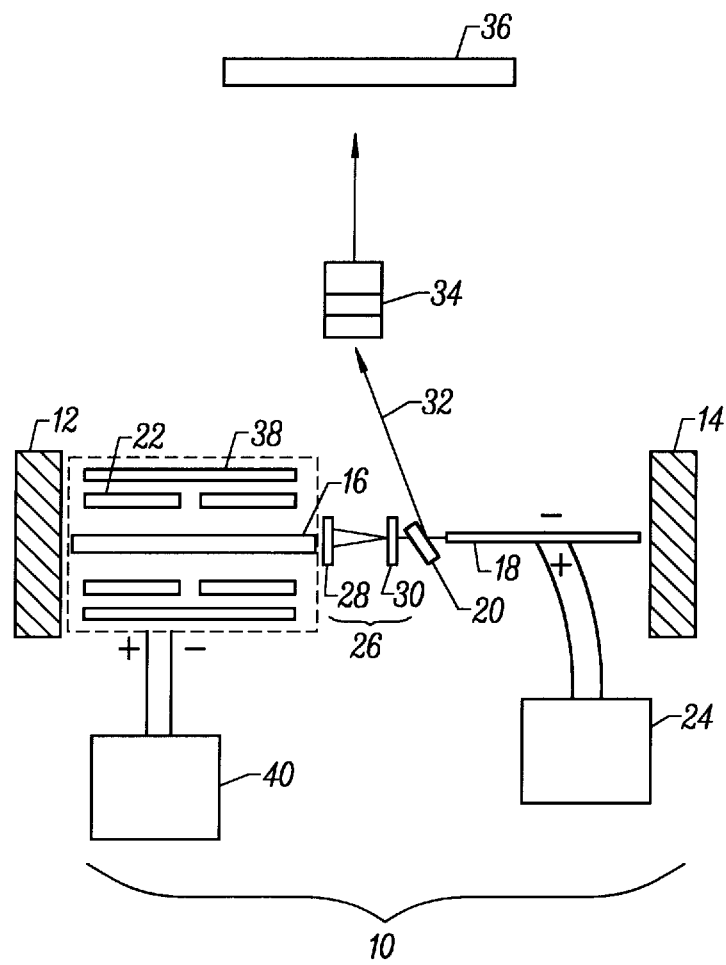
FIG. 1 is a side view of one embodiment of the laser.

Referring to the drawings, FIG. 1 shows a side view of one embodiment of the laser. A resonator cavity 10 has a length designed to generate the desired pulsewidth. The selection of resonator cavity length and other principles of laser design can be found in "Lasers," Anthony E. Siegman, University Science Books, 1986, which is incorporated by reference.

The resonator cavity 10 may contain two fully reflective mirrors 12 and 14 and a gain medium 16. The gain medium 16 is a robust, naturally birefringent crystal such as $Nd:YVO_4$, $Nd:YAlO_3$, or Nd:YLF. Preferably, the gain medium 16 is an $Nd:YAlO_3$ crystal improved with no color centers, available from FEE Idar-Oberstein, Germany. Previous $Nd:YAlO_3$ material would darken under the influence of UV or strong pump light. This of course leads to higher crystal temperature and much more aberration. The color centers have been reduced or eliminated by Preciosa Crystal, Ltd., Turnov, using a non-standard crucible material during crystal growth. FEE Idar-Oberstein uses similar procedures. The gain medium 16 has an anti-reflective coating, such as a sub-wavelength structure. The sub-wavelength structure is a surface relief structure etched directly into the bulk substrate (or barrel of gain medium). A good rule of thumb is that the height of the structures should be approximately 40% of the value of the operational wavelength to achieve minimum reflectance. These structures are much more durable than thin films and cheaper too. They are available from Holographic Lithography Systems, Bedford, Mass., and Rochester Photonics, Rochester, N.Y.

The resonator cavity 10 also contains an electro-optic device 18 positioned along the optical path. The electro-optic device 18 is a material which exhibits minimal ringing at frequencies above 100 kHz, such rubitium titanium arsenate (RTA), available from Crystal Systems, Walwick, N.J., potassium titanyl phosphate (KTP), or beta-barium borate (BBO). Preferably, the electro-optic device 18 is an ultra-high aspect ratio BBO crystal, available from Casix, Fuzhou, China, or Quantum Technology, Lake Mary, Fla.

The resonator cavity 10 also contains a polarizer 20 positioned along the optical path. The polarizer 20 is preferably a high P transmission polarizer, available from VLOC, Tarpon Springs, Fla. The polarizer 20 allows the output beam 32 to be directed out of the resonator cavity 10, directed through focusing optics 34 and directed to the workpiece 36. The output beam 32 may be randomly polarized and then polarized with the polarizer 20.

The gain medium 16 is pumped by a pump source 22. The pump source 22 can be a diode source, a diode bar, or a vertically-emitting diode array. By incorporating arrays of vertically emitting diodes, higher pump power density can be achieved because more emitters can be utilized for a given area. Additionally, a binary lens can be incorporated by etching on the emitter, or on a transparent material over the emitter. This enables control over pump radiation. These vertically-emitting diode arrays are available from IBM, Schenectady, N.Y., and Lucent Technologies, Morristown, N.J. The pump source 22 should be powerful enough to produce a polarized output beam of at least 40 W. Preferably, the pump source 22 is comprised of aluminum-free diodes available from SLIC, Binghamton, N.Y.

The pump source 22 may be radially configured to side pump the gain medium 16. The pump source 22 may be surrounded by reflectors 38 which direct the output of the pump source 22 towards the gain medium 16. The pump source 22 may also side pump the gain medium 16 through radially arranged optical fibers 17. The pump source 22 is powered by a controllable power supply and cooler system 40.

The electro-optic device 18 is charged by a high voltage pulser 24. The high voltage pulser 24 may be comprised of field effect transistors, avalanche diodes, or photo-conductive switches. The high voltage pulser 24 may also be comprised of light-activated silicon switches, available from ECR, Inc., San Diego, Calif., or drift step recovery diodes (DSRDs), drift step recovery transistors (DSRTs), and silicon avalanche shapers (SASs), available from Megapulse, Ltd., St. Petersburg, Russia.

The resonator cavity 10 may also contain an aberration correcting device 26. The aberration correcting device 26 may be comprised of one or more aberration correcting surfaces. The aberration correcting surfaces may be made up of a focusing plate 28 and a collimating plate 30. The aberration correcting surfaces may be gray process surfaces, available from Wavefront Sciences, Albuquerque, N.Mex. The aberration correcting surfaces may also be binary surfaces, aspheric surfaces, or spherical surfaces on a graded-index material. By utilizing gradient glass as the substrate, aspheric equivalence can be achieved with a spherical surface. It is cheaper to manufacture spherical surfaces than aspherical. These materials are available from Light Path, Albuquerque, N. Mex.

The resonator cavity 10 may also contain a mode selecting surface or device, which contains a binary surface that can customize the amplitude and phase of a laser mode. The idea is to reduce the fundamental mode loss to near zero while increasing the second-order mode loss to near 50% or more.

The resonator cavity 10 may also be coupled to an amplifier. By incorporating one or more diode-pumped laser amplifier stages in series, a small signal may be amplified by 3 orders of magnitude or more. This is advantageously used because it is relatively easy to produce a low power signal with a short pulsewidth and excellent spatial quality at megahertz repetition rates. Some examples of signal generating devices are fiber lasers and diode lasers. The signals from these devices may be injected into one or more amplifier stages for amplification to then produce a pulse that has all the qualities of the signal pulse plus sufficient energy to process material efficiently.

The resonator design may be stable or unstable. In a stable resonator the light rays are confined between the surfaces of the resonator mirrors and do not walk out past the edges. The diameter of the TEM$_\infty$ mode is usually limited to a few millimeters or less. This does not advantageously use a large amount of the available gain in a laser rod which has a diameter of 4 mm. In an unstable resonator, the light beam is no longer confined between the mirrors. A light beam in an unconfining or unstable resonator diverges away from the axis. Thus, a large percentage of the active medium gain may be used as the beam expands away from the axis of the gain medium instead of just using the central core.

A big advantage of the current design is that it uses cavity dumping, hence, no output coupler is required. Usually in unstable resonators, a variable reflectivity mirror must be utilized. These are erroneous and finicky.

For Q-switch operation only two particular voltages leading to quarter-wave and half-wave retardation are of interest. In the first case, the incident linearly polarized light is circular polarized after passing the cell, and in the second case the output beam is linearly polarized, but the plane of polarization has been rotated 90°.

For a quarter wave voltage to produce a linear polarized beam, the light must pass through the crystal twice. In any case it is reflected off the mirror and travels back through. It can then be rejected or dumped by the polarizer. However, if a half-wave voltage is used initially then after a single pass the beam is linear polarized and may be immediately dumped. This can be good in that no energy is "trapped" in the cavity being only circularly polarized.

When the dumped pulse or beam exits the resonator cavity 10, an element or surface may be used to corrects the aberrations present to achieve a smaller focused spot. This is especially good extra-cavity because aberrations introduced by the polarizer and/or BBO can be easily compensated for. This device may be aspheric, binary, or gray process.

Figure 2:
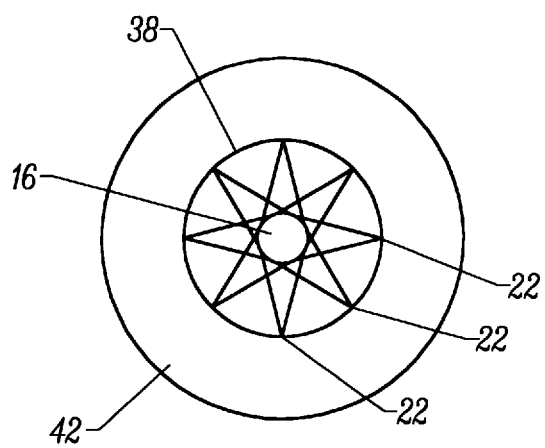
FIG. 2 is a cross-sectional view of another embodiment of the laser.

FIG. 2 shows a cross-sectional view of another embodiment of the laser. The pump source 22 pumps the gain medium 16. The gain medium 16 is surrounded by a reflector 38. The reflector 38 is in turn surrounded by a heat sink 42.

Figure 3:
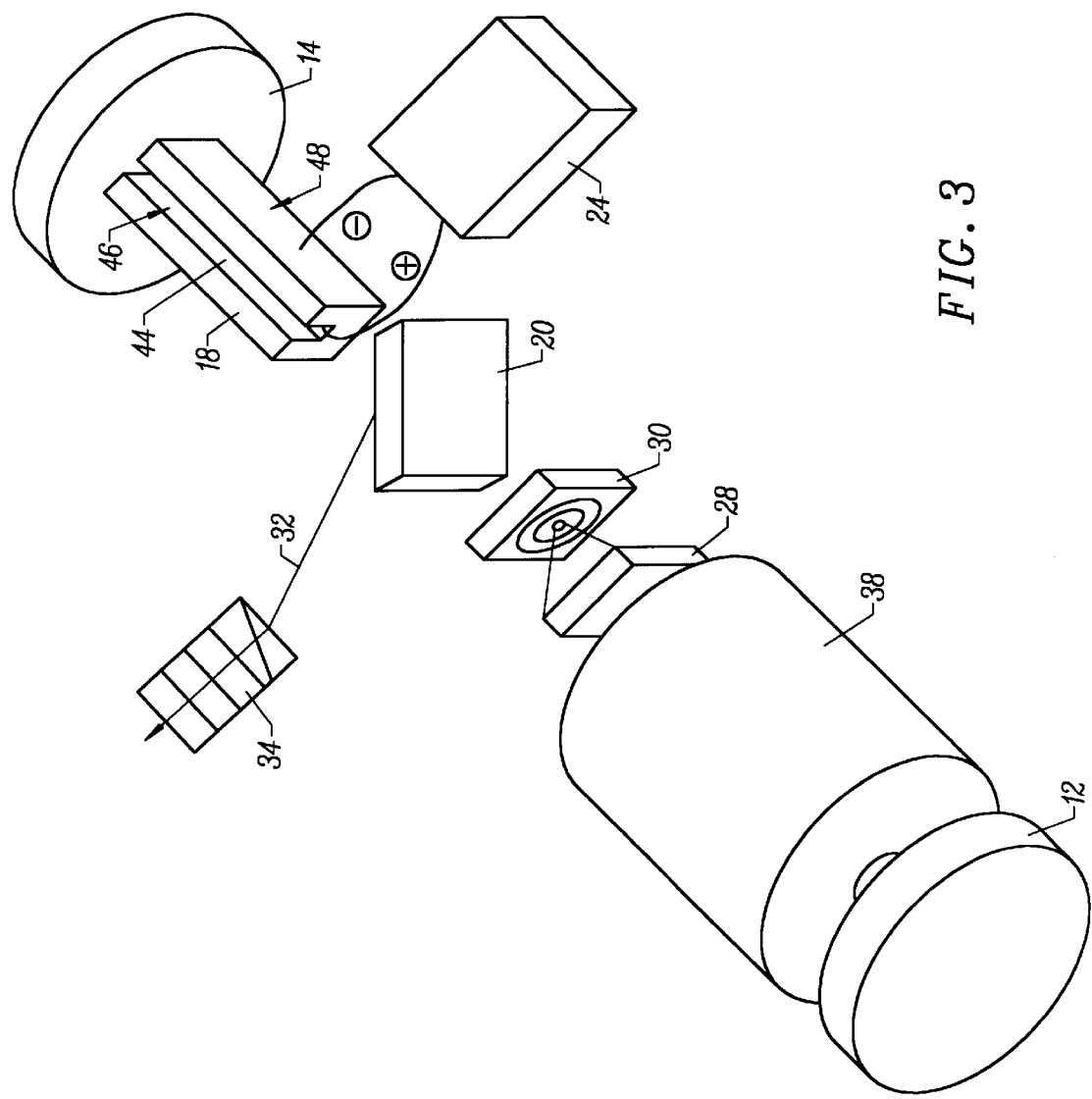
FIG. 3 is a perspective view yet another embodiment of the laser.

FIG. 3 shows a perspective view of another embodiment of the laser. The electro-optic device 18 contains a channel 44, which serves to minimize the distance between the electrodes 46 and 48 and reduce the voltage necessary to induce birefringence.

Figure 4:
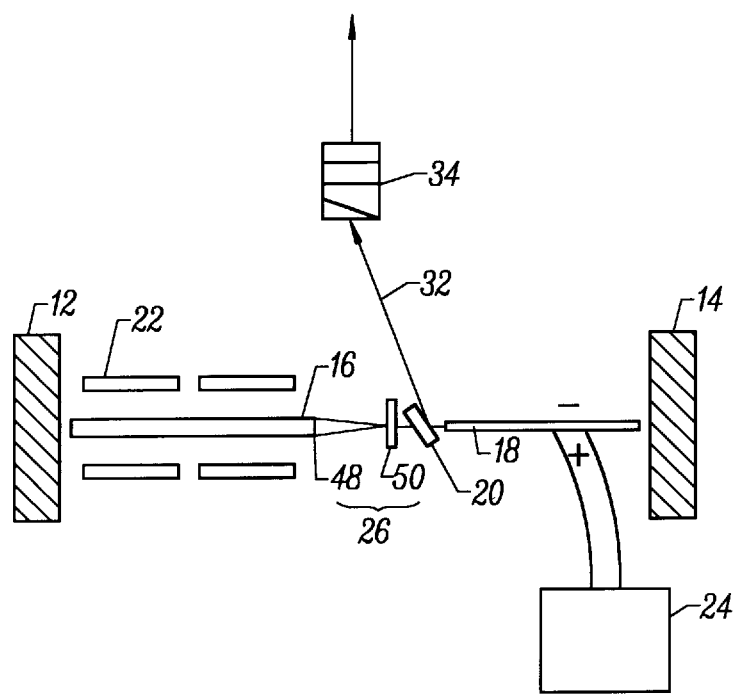
FIG. 4 is a side view of yet another embodiment of the laser.

FIG. 4 shows a side view of another embodiment of the laser. Here, the aberration correcting device 26 is comprised of a binary surface 48 on the end of the gain medium 16 and a separate binary surface 50 located between the gain medium 16 and the polarizer 20.

Figure 5:
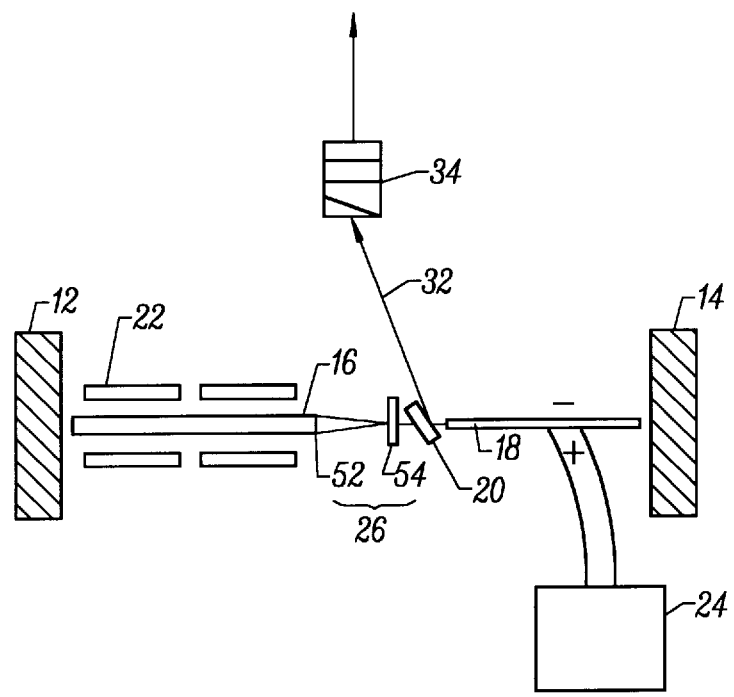
FIG. 5 is a side view of yet another embodiment of the laser.

FIG. 5 shows a side view of another embodiment of the laser. Here, the aberration correcting device 26 is comprised of an aspheric surface 52 located on the end of the gain medium 16 and a separate aspheric surface 54 located between the gain medium 16 and the polarizer 20. The aspheric surface is available from CNC Systems, Rochester, N.Y.

Figure 6:
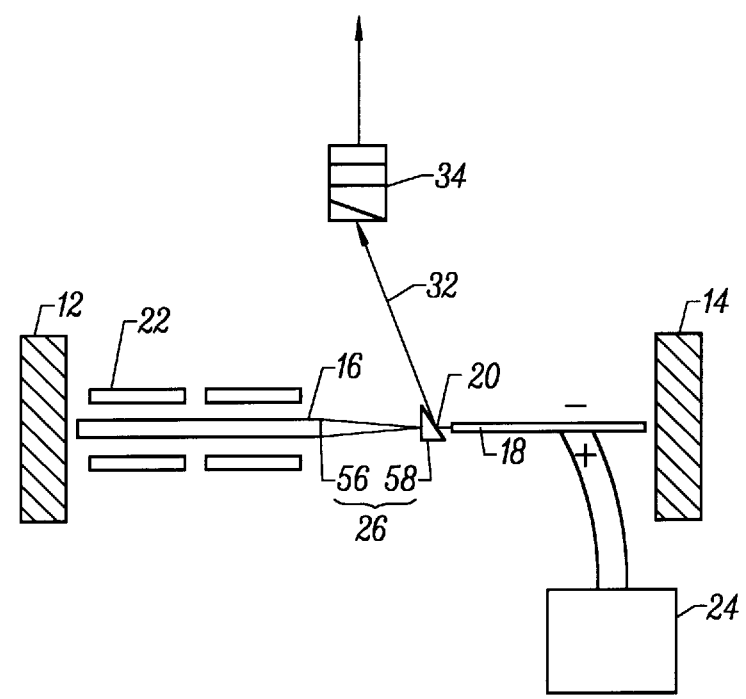
FIG. 6 is a side view of yet another embodiment of the laser.

FIG. 6 is a side view of another embodiment of the laser. Here, the aberration correcting device 26 is comprised of binary etched surfaces 56 and 58 on the gain medium 16 and the polarizer 20, respectively.

Figure 7:
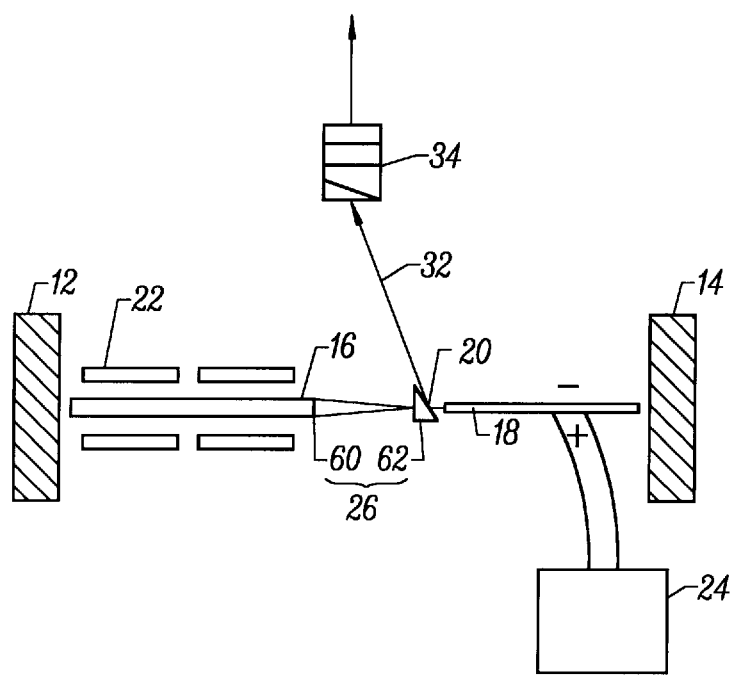
FIG. 7 is a side view of yet another embodiment of the laser.

FIG. 7 is a side view of another embodiment of the laser. Here, the aberration correcting device 26 is comprised of aspheric surfaces 60 and 62 located on the gain medium 16 and the polarizer 20, respectively.

Figure 8:
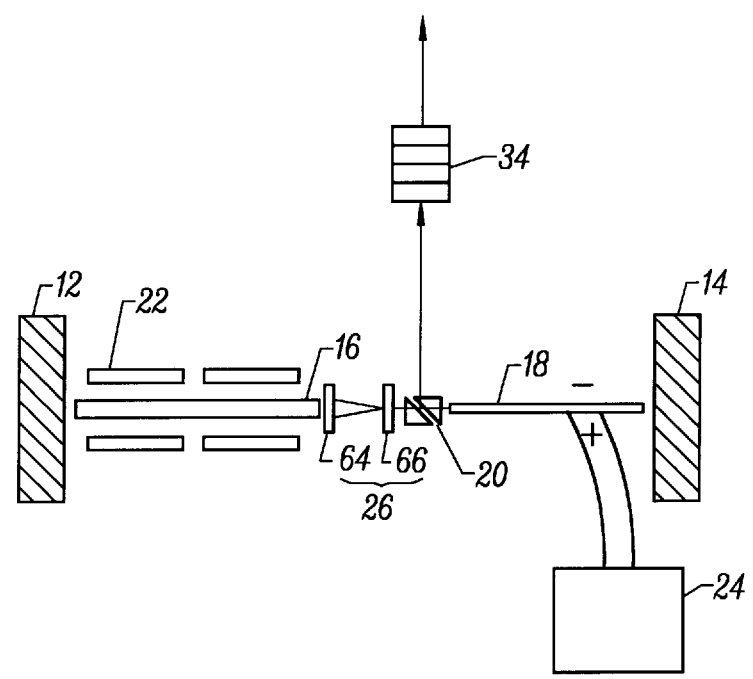
FIG. 8 is a side view of yet another embodiment of the laser.

FIG. 8 is a side view of another embodiment of the laser. Here, the aberration correcting device 26 is comprised of corrector plates with binary etched surfaces 64 and 66 located between the gain medium 16 and the polarizer 20. The polarizer 20 may be an α-BBO polarizing beam splitting cube.

Figure 9:
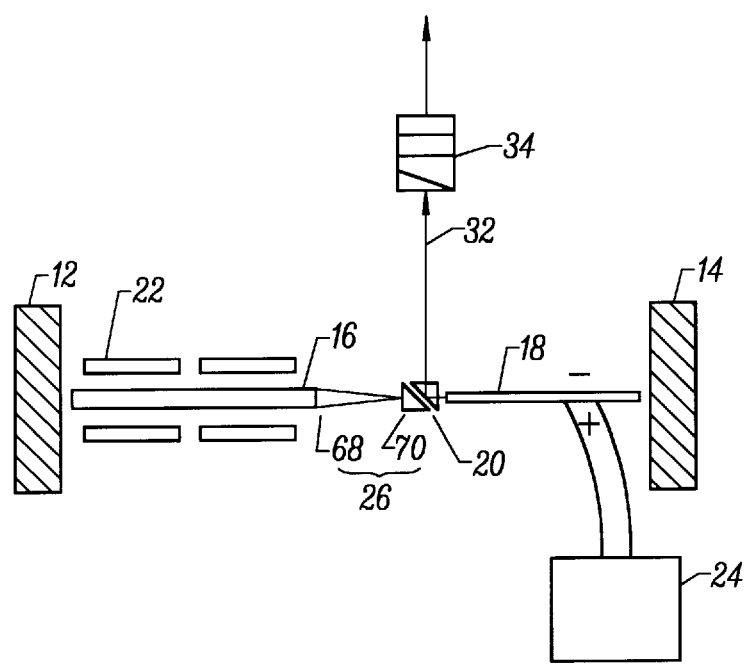
FIG. 9 is a side view of yet another embodiment of the laser.

FIG. 9 is a side view of another embodiment of the laser. Here, aberration correcting device 26 is comprised of an aspheric surface 68 ground onto the end of the gain medium 16, and an aspheric surface 70 ground onto the polarizer 20. The polarizer 20 may be a thin film polarizing beam splitting cube. By utilizing two thin film hypotenuse coated prisms with an air space between them, it is easier to increase the P-transmission to over 99%. These thin film polarizing beam splitting cubes are available from VLOC, Tarpon Springs, Fla.

Figure 10:
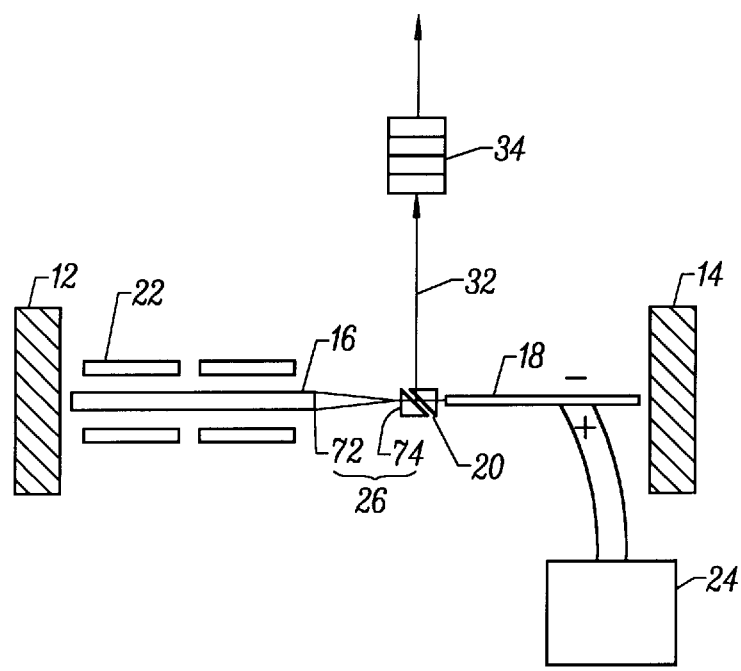
FIG. 10 is a side view of yet another embodiment of the laser.

FIG. 10 is a side view of another embodiment of the laser. Here, the aberration correcting device 26 is comprised of binary surfaces 72 and 74 etched on the gain medium 16 and the polarizer 20, respectively. The polarizer 20 may be a thin film polarizing beam splitting cube.

Figure 11:
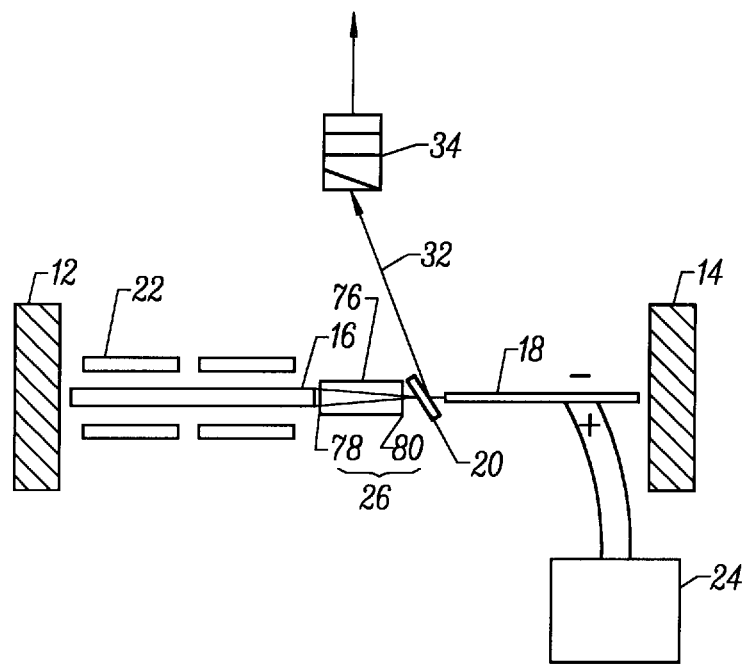
FIG. 11 is a side view of yet another embodiment of the laser.

FIG. 11 is a side view of another embodiment of the laser. Here, the aberration correcting device 26 is comprised of corrector surfaces 78 and 80 located on each end of a monolithic block 76.

Figure 12:
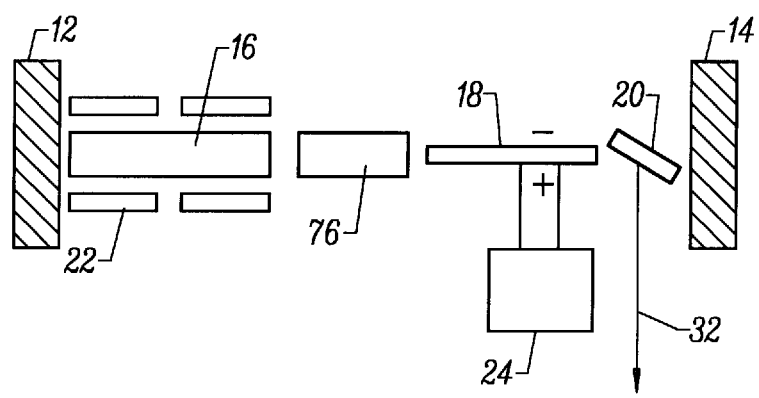
FIG. 12 is a side view of yet another embodiment of the laser.

FIG. 12 is a side view of another embodiment of the laser. Here, the polarizer 20 is positioned between the electro-optic device 18 and the mirror 14.

Figure 13:
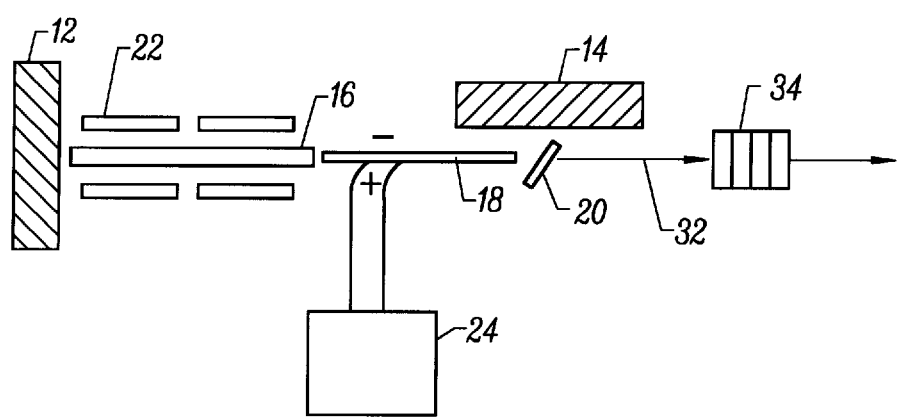
FIG. 13 is a side view of yet another embodiment of the laser.

FIG. 13 is a side view of another embodiment of the laser. Here, the mirror 14 is at an angle from the perpendicular to the gain medium 16 and the electro-optic device 18 has been positioned between the gain medium 16 and the polarizer 20.

Figure 14:
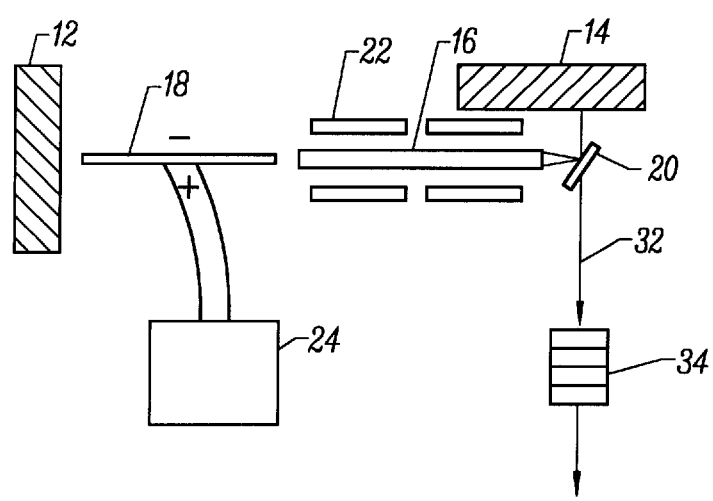
FIG. 14 is a side view of yet another embodiment of the laser.

FIG. 14 is a side view of another embodiment of the laser. Here, the mirror 14 is at an angle from the perpendicular to the gain medium 16 and the electro-optic device 18 has been positioned between the mirror 12 and the gain medium 16.

Figure 15:
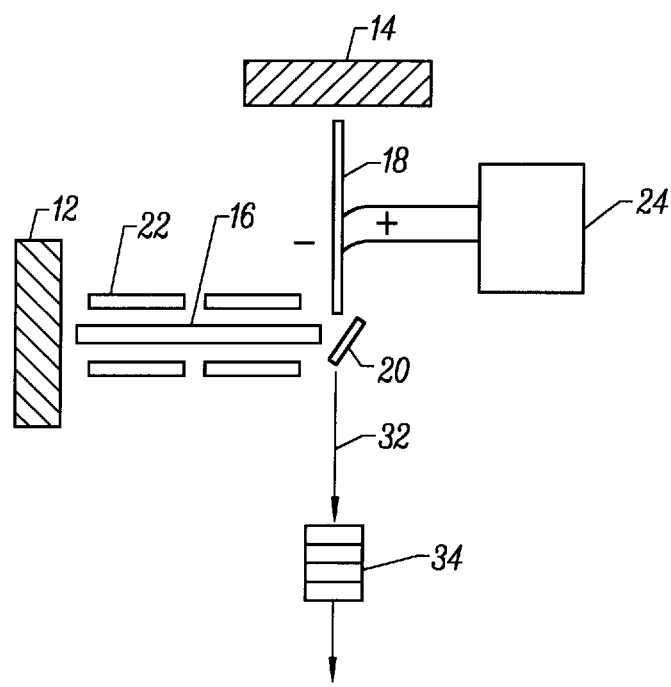
FIG. 15 is a side view of yet another embodiment of the laser.

FIG. 15 is a side view of another embodiment of the laser. Here, the mirror 14 is at an angle from the perpendicular to the gain medium 16. The electro-optic device 18 is at an angle to the gain medium 16 and positioned between the mirror 14 and the polarizer 20.

Figure 16:
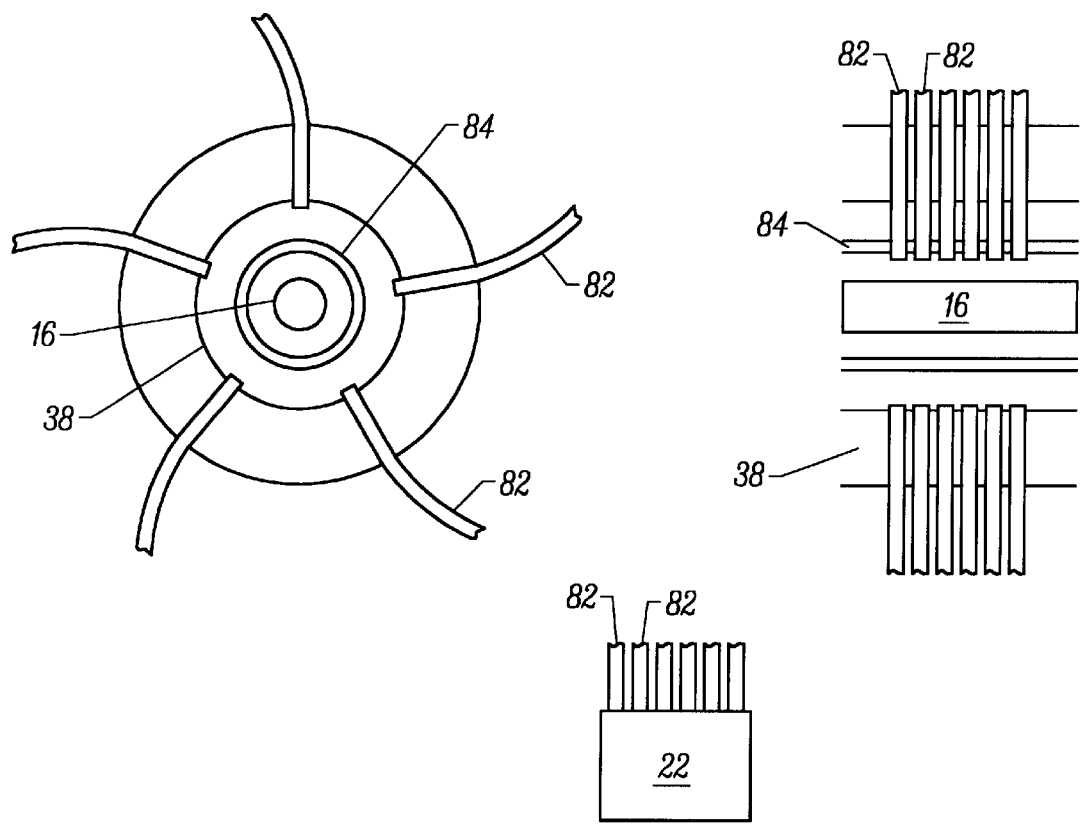
FIG. 16 is a cross-sectional view of yet another embodiment of the laser.

FIG. 16 is a cross-sectional view of another embodiment of the laser. Here, the gain medium 16 is pumped by a pump source 22 through optical fibers 82 coupled to the gain medium 16. The gain medium 16 is cooled by a flow tube 84. The gain medium 16 is also surrounded by a reflector 38.

Figure 17:
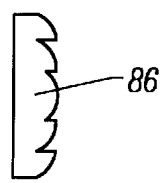
FIG. 17 is a side view of one embodiment of a corrector plate.

FIG. 17 is a side view of one embodiment of a corrector plate 86 with a gray process surface.

Figure 18:
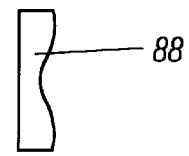
FIG. 18 is a side view of another embodiment of a corrector plate.

FIG. 18 is a side view of another embodiment of a corrector plate 88 with an aspheric surface.

Figure 19:
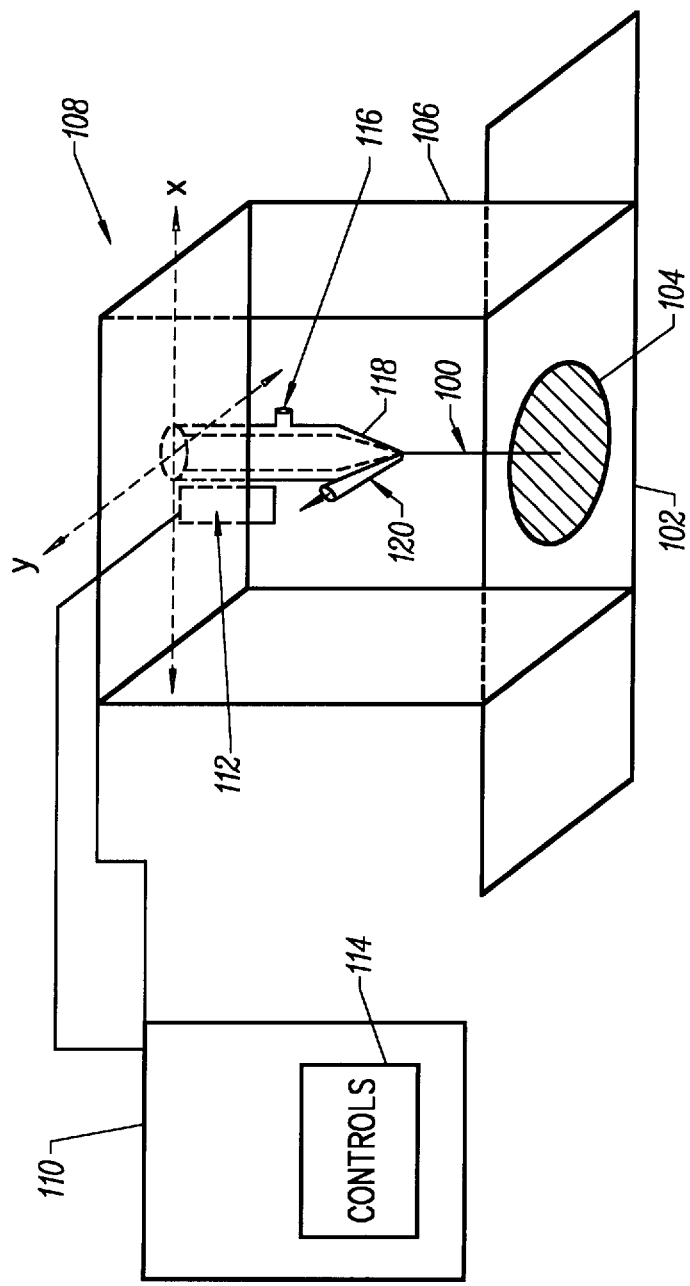
FIG. 19 is a schematic of a laser system for removing material from a substrate.

FIG. 19 is a schematic of a laser system for removing material from a substrate. A substrate holder 102 holds the substrate 104 for cutting by the laser 100. The substrate holder 102 may be a vacuum chuck.

The laser 100 is mounted on a gantry 106. The gantry 106 may be coupled to a positioning device 108 which moves the laser 100 relative to the substrate 104. Alternatively, the substrate holder 102 may be coupled to a positioning device 108 which moves the substrate 104 relative to the laser 100.

The positioning device 108 may be coupled to a controller 110. The controller 110 may be contain a feedback device 112. The feedback device 112 may be a charge-coupled device (CCD) camera with high-magnification optics. Preferably the feedback device 112 is a pattern recognition system, which is able to scan the wafer to locate the fiducials, and locate the streets to direct the cutting, available from Adept Technology, Milpitas, Calif. The controller 110 may also contain user controls 114 for programming the controller 110.

Figure 20:
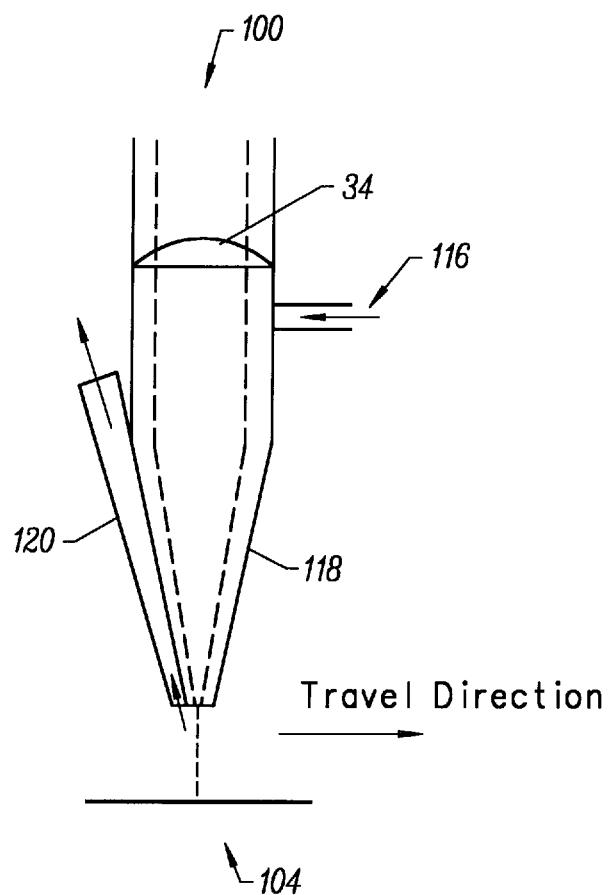
FIG. 20 is a side view of a laser system showing a vacuum pick-up.

FIG. 20 is a side view of a laser system showing a vacuum pick-up. A gas jet 116 is passed into the nozzle 118 and over the focusing optics 34 to the nozzle 118 and focusing optics 34 clear of debris. A vacuum pick-up 120 coupled to the nozzle 120 picks up debris produced by the laser 100. Most of the debris will be removed by the shock wave caused by the laser pulses.

Besides high-precision cutting, this laser system is good for milling, or reaching buried circuit layers. This laser system is also good for high-precision drilling, such as for inkjet heads or fuel injector nozzles. This laser system may also be used for surface processing, such as to harden polymers and metals, and to apply a stain-resistant treatment to carpeting.

The foregoing description of the preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A laser system for removing material from a substrate, comprising:
   a resonator cavity including an optical path;
   a gain medium positioned in the resonator cavity along the optical path;
   an electro-optic device positioned in the resonator along the optical path;
   a polarizer positioned in the resonator cavity along the optical path;
   a pump source generating a pump beam incident on the gain medium to produce an intracavity beam that is incident on a surface of the polarizer to produce a polarized output beam, wherein the polarized output beam has an average power of at least 40 W;
   a high voltage pulser coupled to the electro-optic device and generating a voltage pulse to the electro-optic device, wherein the polarized output beam has a pulsewidth which does not exceed 1.5 nanoseconds at a pulse repetition frequency of at least 100 kHz; and
   a substrate holder for holding and positioning the substrate in a path of the polarized output beam.

2. The system of claim 1, further comprising a positioning device for positioning the polarized output beam and substrate holder relative to each other.

3. The system of claim 2, further comprising a controller coupled to the positioning device.

4. The system of claim 1, further comprising a depolarizing device positioned in the path of the polarized output beam to depolarize the polarized output beam.

5. The system of claim 1, wherein the resonator cavity has a length selected to produce a pulsewidth that does not exceed 1.5 nanoseconds.

6. The laser of claim 1, wherein the resonator cavity has a length not exceeding nine inches.

7. The laser of claim 1, wherein the resonator cavity has a length not exceeding six inches.

8. The laser of claim 1, wherein the resonator cavity has a length not exceeding three inches.

9. The laser of claim 1, wherein the gain medium is a birefringent material.

10. The laser of claim 1, wherein the gain medium is selected from $Nd:YAlO_3$, $Nd:YVO_4$, and Nd:YLF.

11. The laser of claim 1, wherein the gain medium is $Nd:YAlO_3$.

12. The laser of claim 1, wherein the gain medium has an anti-reflective surface.

13. The laser of claim 9, wherein the anti-reflective surface is a sub-wavelength structure.

14. The laser of claim 1, wherein the electro-optic device is a material which exhibits minimal ringing at frequencies above 100 kHz.

15. The laser of claim 1, wherein the electro-optic device is selected from BBO, KTP, and RTA.

16. The laser of claim 1, wherein the electro-optic device is BBO.

17. The laser of claim 1, wherein a distance between the electro-optic device and the high voltage pulser is minimized.

18. The laser of claim 1, wherein the electro-optic device has a high aspect ratio.

19. The laser of claim 18, wherein the high aspect ratio of the electro-optic device is sufficient to reduce a voltage required to induce birefringence in the electro-optic device.

20. The laser of claim 1, wherein the electro-optic device contains a channel to reduce a voltage required to induce birefringence in the electro-optic device.

21. The laser of claim 1, wherein the polarizer is a thin film polarizer.

22. The laser of claim 1, wherein the polarizer is a birefringent polarizer.

23. The laser of claim 1, wherein the polarizer is a binary surface.

24. The laser of claim 1, wherein the pump source is sufficient to produce a polarized output beam of at least 40 W.

25. The laser of claim 1, wherein the pump source is a diode source.

26. The laser of claim 1, wherein the pump source is at least one diode bar.

27. The laser of claim 1, wherein the pump source is at least one vertically-emitting diode array.

28. The laser of claim 1, wherein the pump source is a plurality of aluminum-free diodes.

29. The laser of claim 1, wherein the pump source is configured to side pump the gain medium.

30. The laser of claim 1, wherein the pump source is positioned radially symmetrically around the gain medium.

31. The laser of claim 1, wherein a profile of the pump beam substantially matches a mode volume of the gain medium.

32. The laser of claim 1, further comprising a focusing device positioned between the pump source and the gain medium.

33. The laser of claim 1, wherein the pump source is fiber coupled to the gain medium.

34. The laser of claim 1, wherein the polarized output beam is near diffraction limited.

35. The laser of claim 34, wherein the polarized output beam has an $M^2$ of less than 5.

36. The laser of claim 34, wherein the polarized output beam has an $M^2$ of less than 2.

37. The laser of claim 34, wherein the polarized output beam has an $M^2$ of less than 1.5.

38. The laser of claim 1, wherein the polarized output beam is single mode.

39. The laser of claim 1, wherein the high voltage pulser includes at least one step recovery diode.

40. The laser of claim 1, wherein the high voltage pulser includes at least one drift step recovery diode.

41. The laser of claim 40, wherein the high voltage pulser includes at least one silicon avalanche shaper coupled to the at least one drift step recovery diode.

42. The laser of claim 1, wherein the high voltage pulser includes at least one step recovery transistor.

43. The laser of claim 1, wherein the high voltage pulser includes at least one drift step recovery transistor.

44. The laser of claim 43, wherein the high voltage pulser includes at least one silicon avalanche shaper coupled to the at least one drift step recovery transistor.

45. The laser of claim 1, wherein the high voltage pulser includes at least one field effect transistor.

46. The laser of claim 1, wherein the high voltage pulser includes at least one avalanche diode.

47. The laser of claim 1, wherein the high voltage pulser includes at least one light activated silicon switch.

48. The laser of claim 1, wherein the high voltage pulser includes at least one photo-conductive switch.

49. The laser of claim 1, further comprising an aberration correcting device positioned in the resonator along the optical path, the aberration correcting device including an aberration correcting surface.

50. The laser of claim 49, wherein the aberration correcting surface is a binary surface.

51. The laser of claim 49, wherein the aberration correcting surface is a gray process surface.

52. The laser of claim 49, wherein the aberration correcting surface is an aspheric surface.

53. The laser of claim 49, wherein the aberration correcting surface is a spherical surface on a graded-index material.

54. The laser of claim 49, wherein the aberration correcting surface further provides focusing of the intracavity beam.

55. The laser of claim 1, further comprising an aberration correcting device positioned outside of the resonator along the optical path, the aberration correcting device including an aberration correcting surface.

56. The laser of claim 1, further comprising:
a focusing device positioned in the resonator along the optical path, the focusing device including a focusing surface.

57. The laser of claim 56, wherein the focusing surface is a binary surface.

58. The laser of claim 56, wherein the focusing surface is a gray process surface.

59. The laser of claim 56, wherein the focusing surface is an aspheric surface.

60. The laser of claim 1, further comprising:
a mode selection device positioned in the resonator along the optical path, the mode selection device including a mode selecting surface.

61. The laser of claim 60, wherein the mode selecting surface is a binary surface.

62. The laser of claim 60, wherein the mode selecting surface is a grey process surface.

63. The laser of claim 1, further comprising a collimating device positioned in the resonator along the optical path, the collimating device including a collimating surface.

64. The laser of claim 63, wherein the collimating surface is a binary surface.

65. The laser of claim 63, wherein the collimating surface is a gray process surface.

66. The laser of claim 63, wherein the collimating surface is an aspheric surface.

* * * * *